(12) United States Patent  
Luan et al.

(10) Patent No.: US 7,253,050 B2
(45) Date of Patent: Aug. 7, 2007

(54) TRANSISTOR DEVICE AND METHOD OF MANUFACTURE THEREOF

(75) Inventors: Hongfa Luan, Austin, TX (US); Hong-Jyh Li, Austin, TX (US)

(73) Assignee: Infineon Technologies AG, Munich (DE)

( * ) Notice: Subject to any disclaimer, the term of this patent is extended or adjusted under 35 U.S.C. 154(b) by 141 days.

(21) Appl. No.: 11/017,129

(22) Filed: Dec. 20, 2004

(65) Prior Publication Data

US 2006/0134870 A1 Jun. 22, 2006

(51) Int. Cl.
*H01L 21/8238* (2006.01)

(52) U.S. Cl. ............... 438/232; 438/659; 257/E21.637

(58) Field of Classification Search ........... 438/232, 438/532, 659; 257/E21.637
See application file for complete search history.

(56) References Cited

U.S. PATENT DOCUMENTS

| | | | |
|---|---|---|---|
| 4,432,035 A | 2/1984 | Hsieh et al. | |
| 5,066,995 A | 11/1991 | Young et al. | |
| 5,162,263 A | 11/1992 | Kunishima et al. | |
| 5,763,922 A | 6/1998 | Chau | |
| 6,020,243 A | 2/2000 | Wallace et al. | |
| 6,027,961 A * | 2/2000 | Maiti et al. | 438/592 |
| 6,048,769 A | 4/2000 | Chau | |
| 6,124,171 A | 9/2000 | Arghavani et al. | |
| 6,159,782 A | 12/2000 | Xiang et al. | |
| 6,184,072 B1 | 2/2001 | Kaushik et al. | |
| 6,225,163 B1 | 5/2001 | Bergemont | |
| 6,291,867 B1 | 9/2001 | Wallace et al. | |
| 6,444,555 B2 | 9/2002 | Ibok | |
| 6,475,908 B1 * | 11/2002 | Lin et al. | 438/659 |
| 6,492,217 B1 | 12/2002 | Bai et al. | |
| 6,528,858 B1 | 3/2003 | Yu et al. | |
| 6,716,685 B2 | 4/2004 | Lahaug | |
| 6,720,221 B1 | 4/2004 | Ahn et al. | |
| 6,740,944 B1 | 5/2004 | McElheny et al. | |
| 6,897,095 B1 | 5/2005 | Adetutu et al. | |
| 6,921,691 B1 | 7/2005 | Li et al. | |

(Continued)

FOREIGN PATENT DOCUMENTS

| | | |
|---|---|---|
| EP | 1 531 496 A2 | 5/2005 |
| JP | 2002118175 | 4/2002 |
| JP | 2004289061 | 10/2004 |
| WO | WO 01/66832 A2 | 9/2001 |
| WO | WO 2004/095556 A1 | 11/2004 |
| WO | WO 2006/061371 A1 | 6/2006 |
| WO | WO 2006/067107 A1 | 6/2006 |

OTHER PUBLICATIONS

Wakabayashi, H., et al., "A Dual-Metal Gate CMOS Technology Using Nitrogen-Concentration-Controlled TiNx Film," IEEE Transactions on Electron Devices, Oct. 2001, pp. 2363-2369, vol. 48, No. 10, IEEE, Los Alamitos, CA.

(Continued)

*Primary Examiner*—Chandra Chaudhari
(74) *Attorney, Agent, or Firm*—Slater & Matsil, L.L.P.

(57) ABSTRACT

Methods of forming CMOS devices and structures thereof. A workpiece is provided having a first region and a second region. A high k gate dielectric material is formed over the workpiece. A first gate material comprising a first metal is formed over the high k gate dielectric material. The first gate material in the second region is implanted with a material different than the first metal to form a second gate material comprising a second metal. The work function of the CMOS device is set by the material selection of the gate materials.

23 Claims, 6 Drawing Sheets

U.S. PATENT DOCUMENTS

| | | |
|---|---|---|
| 2002/0005556 A1 | 1/2002 | Cartier et al. |
| 2002/0135030 A1 | 9/2002 | Horikawa |
| 2002/0135048 A1 | 9/2002 | Ahn et al. |
| 2002/0151125 A1 | 10/2002 | Kim et al. |
| 2002/0153573 A1 | 10/2002 | Mogami |
| 2003/0057432 A1 | 3/2003 | Gardner et al. |
| 2003/0104663 A1 | 6/2003 | Visokay et al. |
| 2003/0137017 A1 | 7/2003 | Hisamoto et al. |
| 2003/0219953 A1 | 11/2003 | Mayuzumi |
| 2004/0000695 A1 | 1/2004 | Matsuo |
| 2004/0005749 A1 | 1/2004 | Choi et al. |
| 2004/0009675 A1 | 1/2004 | Eissa et al. |
| 2004/0023462 A1 | 2/2004 | Rotondaro et al. |
| 2004/0132271 A1 | 7/2004 | Ang et al. |
| 2004/0217429 A1 | 11/2004 | Lin et al. |
| 2005/0035345 A1 | 2/2005 | Lin et al. |
| 2005/0064663 A1 | 3/2005 | Saito |
| 2005/0101159 A1 | 5/2005 | Droopad |
| 2005/0139926 A1 | 6/2005 | Shimizu et al. |
| 2005/0245019 A1 | 11/2005 | Luo et al. |
| 2005/0280104 A1 | 12/2005 | Li |

OTHER PUBLICATIONS

Lin, R., et al., "An Adjustable Work Function Technology Using Mo Gate for CMOS Devices," IEEE Electron Device Letters, Jan. 2002, pp. 49-51, vol. 23, No. 1, IEEE, Los Alamitos, CA.

"Front End Processes," The International Technology Roadmap for Semiconductors: 2003 Edition, pp. 23-25, http://member.itrs.net/.

Gannavaram, S., et al., "Low Temperature (s 800° C) Recessed Junction Selective Silicon-Germanium Source/Drain Technology for sub-70 nm CMOS," 2000, 4 pp., IEEE, Lost Alamitos, CA.

Huang, F.-J., et al., "Schottky-Clamped NMOS Transistors Implemented in a Conventional 0.8-μm CMOS Process," IEEE Electron Device Letters, Sep. 1998, pp. 326-328, vol. 19, No. 9, IEEE, Los Alamitos, CA.

Park, D.-G., et al., "Thermally Robust Dual-Work Function ALD-$MN_x$ MOSFETs using Conventional CMOS Process Flow," 2004 Symposium on VLSI Technology Digest of Technical Papers, 2004, pp. 186-187, IEEE, Los Alamitos, CA.

Guha, S., et al., "Atomic Beam Deposition of Lanthanum- and Yttrium-Based Oxide Thin Films for Gate Dielectrics," Applied Physics Letters, Oct. 23, 2000, vol. 77, No. 17, pp. 2710-2712, American Institute of Physics.

Muller, R.S., et al., "Device Electronics for Integrated Circuits," Second Ed., 1986, pp. 380-385, 398-399, John Wiley & Sons, New York, NY.

Hobbs, C., et al., "Fermi Level Pinning at the PolySi/Metal Oxide Interface,"2003 Symposium on VLSI Technology Digest of Technical Papers, Jun. 2003, 2 pages.

Samavedam, S.B., et al., "Fermi Level Pinning with Sub-Monolayer MeOx and Metal Gates," IEEE, Mar. 2003, 4 pages.

"Front End Processes." International Technology Roadmap for Semiconductor (ITRS), 2002 Update, pp. 45-62, http://member.itrs.net/.

"High K Dielectric Materials," Tutorial: Materials for Thin Films / Microelectronics, pp. 1-3, Sigma-Aldrich Co., St. Lois, Missouri, US, http://www.sigmaaldrich.com/Area_of_Interest/Organic_Inorganic_Chemistry/Materials_Science/Thin_Films_Microelectronics/Tutorial/Dielectric_Materials.html, downloaded Jun. 9, 2004.

Wolf, S., "Silicon Processing for the VLSI Era: vol. 2—Process Integration," pp. 432-441, Lattice Press, Sunset Beach, CA, 1990.

Hobbs, C.C., et al., "Fermi-Level Pinning at the Polysilicon/Metal Oxide Interface—Part 1," IEEE Transactions on Electron Devices, vol. 51, No. 6, Jun. 2004, pp. 971-977.

* cited by examiner

TRANSISTOR DEVICE AND METHOD OF MANUFACTURE THEREOF

TECHNICAL FIELD

The present invention relates generally to semiconductor devices, and more particularly to transistors and methods of manufacturing thereof.

BACKGROUND

Semiconductor devices are used in a variety of electronic applications, such as personal computers, cell phones, digital cameras, and other electronic equipment, as examples. Semiconductor devices are typically fabricated by sequentially depositing insulating (or dielectric) layers, conductive layers, and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET).

Early MOSFET processes used one type of doping to create either positive or negative channel transistors. More recent designs, referred to as complimentary MOS (CMOS) devices, use both positive and negative channel devices, e.g., a positive channel metal oxide semiconductor (PMOS) transistor and a negative channel metal oxide semiconductor (NMOS) transistor, in complimentary configurations. An NMOS device negatively charges so that the transistor is turned on or off by the movement of electrons, whereas a PMOS devices involves the movement of electron vacancies. While the manufacture of CMOS devices requires more manufacturing steps and more transistors, CMOS devices are advantageous because they utilize less power, and the devices may be made smaller and faster.

The gate dielectric for MOSFET devices has in the past typically comprised silicon dioxide, which has a dielectric constant of about 3.9. However, as devices are scaled down in size, using silicon dioxide for a gate dielectric becomes a problem because of gate leakage current, which can degrade device performance. Therefore, there is a trend in the industry towards the development of the use of high dielectric constant (k) materials for use as the gate dielectric in MOSFET devices. The term "high k dielectric materials" as used herein refers to a dielectric material having a dielectric constant of about 4.0 or greater.

High k gate dielectric development has been identified as one of the future challenges in the 2002 edition of International Technology Roadmap for Semiconductors (ITRS), incorporated herein by reference, which identifies the technological challenges and needs facing the semiconductor industry over the next 15 years. For low power logic (for portable electronic applications, for example), it is important to use devices having low leakage current, in order to extend battery life. Gate leakage current must be controlled in low power applications, as well as sub-threshold leakage, junction leakage, and band-to-band tunneling.

In electronics, the "work function" is the energy, usually measured in electron volts, needed to remove an electron from the Fermi level to a point an infinite distance away outside the surface. Work function is a material property of any material, whether the material is a conductor, semiconductor, or dielectric. The work function of a metal is a fixed value. The work function of a semiconductor can be changed by doping the semiconductor material. For example, undoped polysilicon has a work function of about 4.5 eV, whereas polysilicon doped with boron has a work function of about 5.0 eV. The work function of a semiconductor or conductor directly affects the threshold voltage of a transistor when the material is used as a gate electrode.

In prior art CMOS devices utilizing $SiO_2$ as the gate dielectric material, the work function of a CMOS device could be changed or tuned by doping the polysilicon used for the gate electrode material. However, high-k gate dielectric materials such as a hafnium-based dielectric material exhibit a Fermi-pinning effect, which is caused by the interaction of the high-k gate dielectric material with the adjacent gate material. When used as a gate dielectric, high k gate dielectric material pins or fixes the work function, so that doping the polysilicon gate material does not change the work function. Thus, a symmetric $V_t$ for the NMOS and PMOS transistors of a CMOS device having a high k dielectric material for the gate dielectric cannot be achieved by doping polysilicon gate material, as in $SiO_2$ gate dielectric CMOS devices.

Using a metal gate or silicided gate also results in an asymmetric work function when the gate dielectric material comprises a high k dielectric material. The Fermi-pinning effect of high k gate dielectric materials causes a threshold voltage shift and low mobility, due to the increased charge caused by the Fermi-pinning effect. Fermi-pinning of high k gate dielectric material causes an assymmetric turn-on threshold voltage $V_t$ for the transistors of a CMOS device, which is undesirable. Efforts have been made to improve the quality of high-k dielectric films and resolve the Fermi-pinning problems, but the efforts have resulted in little success.

Thus, what is needed in the art is a CMOS transistor device and method of manufacturing thereof that has a high-k gate dielectric material and a symmetric $V_t$ for the p channel metal oxide semiconductor (PMOS) and n channel metal oxide semiconductor (NMOS) transistors of the CMOS device.

SUMMARY OF THE INVENTION

These and other problems are generally solved or circumvented, and technical advantages are generally achieved, by preferred embodiments of the present invention, which comprise novel structures and methods of forming dual metal gate electrode CMOS devices, wherein the dual gate metal materials are formed by implantation. The PMOS and NMOS transistors of the CMOS devices comprise a high k gate dielectric material and the PMOS gate and the NMOS gate comprise different metals. At least one of the transistor gate materials is implanted with a material to form a different metal in one of the transistor gates. Because the PMOS and NMOS transistor gates comprise different metals, the materials of the gates can be selected to achieve a symmetric work function for the PMOS and NMOS transistors.

In accordance with a preferred embodiment of the present invention, a method of manufacturing a semiconductor device includes providing a workpiece, the workpiece comprising a first region and a second region, forming a gate dielectric material over the workpiece, and forming a first gate material over the gate dielectric material, the first gate material comprising a first metal. A material is implanted into the first gate material over the second region of the workpiece to form a second gate material in the second region of the workpiece. The first gate material, the second gate material, and the gate dielectric are patterned to form a first transistor in the first region of the workpiece and a second transistor in the second region of the workpiece, the first transistor including a first gate comprised of the first gate material, and the second transistor including a second gate comprised of the second gate material.

In accordance with another preferred embodiment of the present invention, a method of manufacturing a CMOS device includes providing a workpiece, the workpiece comprising a first region and a second region, forming a gate dielectric material over the workpiece, the gate dielectric material comprising a dielectric constant of about 4.0 or greater, and forming a first gate material over the gate dielectric material, the first gate material comprising a first metal. A first material is implanted into the first gate material over the second region of the workpiece to form a second gate material in the second region of the workpiece, the second gate material comprising a second metal, the second metal comprising the first metal and the first material. The first gate material, the second gate material, and the gate dielectric material are patterned to form a first transistor in the first region of the workpiece and a second transistor in the second region of the workpiece. The first transistor includes a first gate comprised of the first gate material, and the second transistor includes a second gate comprised of the second gate material. Forming either the first transistor or the second transistor comprises forming a PMOS device or an NMOS device.

In accordance with yet another preferred embodiment of the present invention, a CMOS device includes a workpiece, the workpiece including a first region and a second region, and a gate dielectric disposed over the workpiece, wherein the gate dielectric comprises a dielectric constant of about 4.0 or greater. A first gate is disposed over the gate dielectric in the first region of the workpiece, the first gate comprising a first metal and comprising a gate of a first transistor. A second gate is disposed over the gate dielectric in the second region of the workpiece, the second gate comprising the first metal implanted with a material and comprising a gate of a second transistor, the material being different than the first metal. One of the first transistor or the second transistor comprises a PMOS device, and the other of the first transistor or the second transistor comprises an NMOS device.

Advantages of preferred embodiments of the present invention include providing methods of fabricating CMOS devices and structures thereof wherein the PMOS transistor and NMOS transistor have a substantially symmetric $V_t$. Implantation is used to alter the metal of the gate of the PMOS transistor, the gate of the NMOS transistor, or both. The material selection of the metal gates sets the work function of the CMOS devices. Because a separate etch process is not used to remove one of the metal material types from over the high k dielectric gate material, damage to and/or charging of the high k gate dielectric material is avoided.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
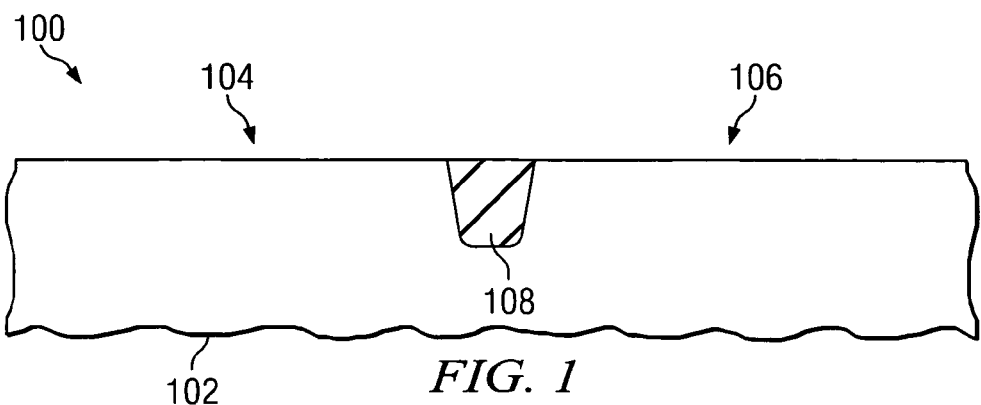
FIGS. 1 through 5 show cross-sectional views of a semiconductor device at various stages of manufacturing in accordance with a preferred embodiment of the present invention, wherein a CMOS device comprises a first transistor having a gate comprising a first metal and a second transistor having a gate comprising a second metal, wherein the first metal in the region of the second transistor is implanted with a first material so that the second transistor gate comprises a second metal that is different from the first metal.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

When used as a gate dielectric of a transistor, high-k gate dielectric materials generally yield orders of magnitude lower gate leakage current than $SiO_2$ gate dielectric materials with the same effective oxide thickness (EOT). For low standby power (LSTP) and high performance (HP) applications, a high-k gate dielectric is a potential solution in the roadmap for the advanced technology nodes. High k gate dielectric materials are expected to achieve the EOT, gate leakage ($J_g$), mobility, and hysteresis parameters required by LSTP applications. However, $V_t$ controllability with high k gate dielectric materials is proving challenging. In order to make high k gate dielectric materials useful in CMOS applications, the CMOS device requires a symmetrical $V_{tn}$ and $V_{tp}$ (e.g., $V_{tn}$=0.3 V and $V_{tp}$=−0.3 V).

Attempts to use a high-k dielectric material such as $HfO_2$ as a gate dielectric material have been problematic. In particular, attempts have been made to use $HfO_2$, which is a high-k dielectric material having a dielectric constant of about 25, as the gate dielectric for both the PMOS and NMOS FETs of a CMOS device. The work function of a polysilicon gate using a $HfO_2$ gate dielectric has been found to be pinned, as a result of Fermi-pinning, at a point close to the conduction band of polysilicon, causing the polysilicon gate to function as N type polysilicon, even for the polysilicon gate doped with P type dopant, for the PMOS device. Therefore, the threshold voltage $V_{tp}$ of the PMOS device was found to be much higher than expected; e.g., $V_{tp}$ was −1.2 V while $V_{tn}$ was 0.4 V, which is very asymmetric. The Fermi-pinning effect is suspected to be related to the Hf—Si bond at the gate electrode to gate dielectric interface, which is almost impossible to avoid with a polysilicon-$HfO_2$ gate stack structure. Therefore, the Fermi-pinning effect makes the use of polysilicon as a gate electrode incompatible with Hf-based high-k gate dielectric materials in CMOS devices. Fully silicided polysilicon (FUSI) gates have also exhibited Fermi-pinning effects and are undesirable for use as gate electrode materials when a high-k dielectric such as hafnium is used for a gate dielectric.

Therefore, to avoid the Fermi-pinning problem, one solution suggested herein is to use one type of metal as a gate electrode in the PMOS transistor, and to use a different type of metal as a gate electrode in the NMOS transistor. However, it would be undesirable to deposit one type of metal over the entire surface of a high k gate dielectric material, over both the PMOS region and the NMOS region, and to etch away that metal from one region, e.g., the NMOS region, before depositing a different type of metal over the NMOS region. Such a process would be disadvantageous because the high k dielectric material may be damaged during the etch process to remove the metal first deposited over the high k dielectric material. For example, to etch metals, typically a wet etch process is used, which can damage an underlying high k dielectric material and/or put a charge on the high k dielectric material.

Embodiments of the present invention achieve technical advantages by forming a different metal for the gate material in either the PMOS or NMOS portion of a CMOS device, using implantation of a material into one or both of the gate materials. The material selection for the gates of the PMOS and NMOS transistors sets the work function of the device. Because metal is used as the gate material and is used to set the work function, the use of a high k gate dielectric material does not create asymmetry in the work function of the CMOS device. In some embodiments, the gates of the PMOS and NMOS transistors include a layer of semiconductive material disposed at a top surface thereof. In some embodiments, the implanted material comprises a metal, and in other embodiments, the implanted material comprises a semiconductive material or a nitride. Because implantation is used to form a second type of metal, rather than depositing a second type of metal and removing it, an additional metal etching step is avoided, reducing damage to the high k gate dielectric material.

The present invention will be described with respect to preferred embodiments in a specific context, namely a CMOS transistor. Embodiments of the present invention may also be applied, however, to other semiconductor device applications where two or more transistors are utilized. Note that in the drawings shown, only one PMOS device and one NMOS device are shown; however, there may be many PMOS and NMOS devices formed on a semiconductor workpiece during each of the manufacturing processes described herein.

FIGS. 1 through 5 show cross-sectional views of a semiconductor device 100 at various stages of manufacturing in accordance with a preferred embodiment of the present invention. With reference now to FIG. 1, there is shown a semiconductor device 100 in a cross-sectional view including a workpiece 102. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may also comprise a silicon-on-insulator (SOI) substrate.

The workpiece 102 includes a first region 104 and a second region 106. The first region 104 may comprise a region where a first transistor comprising a PMOS device or PMOSFET, as examples, will be formed. The second region 106 may comprise a region where a second transistor comprising an NMOS device or NMOSFET will be formed, as examples. The PMOS device and NMOS device are not shown in FIG. 1: see FIG. 5 at 138 and 140, respectively. Alternatively, the first region 104 may comprise a region where an NMOS device or NMOSFET will be formed, and the second region 106 may comprise a region where a PMOS or PMOSFET will be formed, as examples.

The first region 104 and the second region 106 may be separated by an optional shallow trench isolation (STI) region 108 formed in the workpiece 102, as shown. The first region 104 may be doped with N type dopants, e.g., to form an N well, and the second region 106 may be doped with P type dopants, e.g., to form a P well, e.g., if a PMOS device and an NMOS device will be formed in the first region 104 and second region 106, respectively. In general, the workpiece 102 is doped with N or P type dopants depending on whether the junctions of the transistor to be formed will be P or N type, respectively.

The workpiece 102 may be cleaned using a pre-gate clean process to remove contaminants or native oxide from the top surface of the workpiece 102. The pre-gate treatment may comprise a HF, HCl or ozone based cleaning treatment, as examples, although the pre-gate treatment may alternatively comprise other chemistries.

Figure 2:
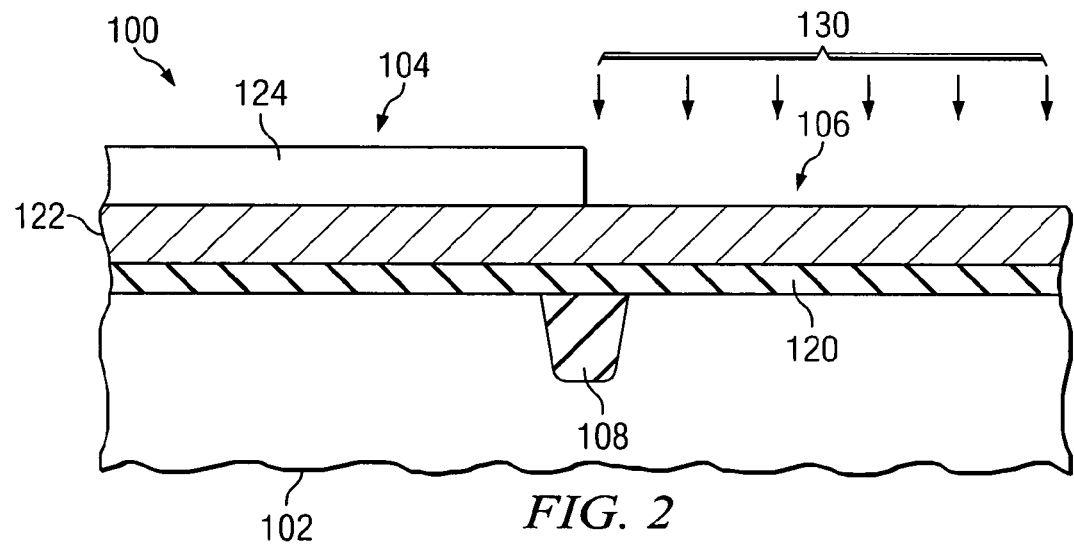

A gate dielectric material 120 is formed over the workpiece 102, as shown in FIG. 2. The gate dielectric material 120 preferably comprises a high k dielectric material having a dielectric constant of about 4.0 or greater, for example. The gate dielectric material 120 preferably comprises $HfO_2$, $HfSiO_x$, $Al_2O_3$, $ZrO_2$, $ZrSiO_x$, $Ta_2O_5$, $La_2O_3$, nitrides thereof, $Si_xN_y$, SiON, $HfAlO_x$, $HfAlOxN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, ZrSiAlO$_x$, ZrSiAlO$_x$N$_y$, combinations thereof, or combinations thereof with SiO$_2$, as examples, although alternatively, the gate dielectric material 120 may comprise other high k dielectric materials or other dielectric materials. The gate dielectric material 120 may comprise a single layer of material, or alternatively, the gate dielectric material 120 may comprise two or more layers. In one embodiment, one or more of these materials can be included in the gate dielectric material 120 in different combinations or in stacked layers. The gate dielectric material 120 may be formed by chemical vapor deposition (CVD), atomic layer deposition (ALD), metal organic chemical vapor deposition (MOCVD), physical vapor deposition (PVD), or jet vapor deposition (JVD), as examples, although alternatively, the gate dielectric material 120 may be formed using other techniques. The gate dielectric material 120 preferably comprises a thickness of about 10 Å to about 60 Å in one embodiment, although alternatively, the gate dielectric material 120 may comprise other dimensions, such as about 80 Å or less, as an example.

A gate material 122 is deposited over the gate dielectric material 120, also shown in FIG. 2. The gate material 122 preferably comprises a metal in accordance with embodiments of the present invention. The gate material 122 comprises a first metal in one embodiment. The first metal preferably comprises a pure metal, a metal alloy, a metal nitride, a metal silicon nitride, or a metal silicide, as examples. The gate material 122 may comprise Ti, Hf, Ta, W, Al, Ru, Co, Ir, Y, Pt, Pd, Re, Rh, Zr, Mo, Pr, V, or combinations thereof, as examples, although alternatively, the gate material 122 may comprise other conductive materials. The gate material 122 may be deposited by CVD, PVD, ALD, or other deposition techniques, as examples. The gate material 122 preferably comprises a thickness of about 1000 Å or less, although alternatively, the gate material 122 may comprise about 300 Å to about 700 Å, or other dimensions, for example. In one embodiment, the gate material 122 preferably comprises about 500 Å of Ru, Mo, or Ta, for example.

A mask 124 is deposited over the gate material 122, as shown in FIG. 2. The mask 124 preferably comprises a photoresist material, although alternatively, the mask 124 may comprise an oxide or nitride material, as examples. The mask 124 is patterned with a lithography mask using traditional lithography techniques, although alternatively, the mask 124 may be directly patterned using electron beam lithography (EBL) or other direct etching techniques, as examples. The mask 124 is preferably patterned and etched to remove the mask 124 in either the first region 104 or the second region 106 of the workpiece 102. In the embodiment shown, the mask 124 is removed from over the second region 106 of the workpiece 102.

Next, the exposed gate material 122 is implanted with a material 130 to alter the gate material 122 in the second region 106. The implanted material 130 preferably comprises a first material, in one embodiment, wherein the first material comprises a different material than the first metal of the gate material 122. In one embodiment, the first material comprises Ta or Hf, although alternatively, the first material may comprise other materials. The implanted first material 130 may comprise Ta, Hf, Ru, Mo, Re, Pt, Si, or N, as examples, although other materials may also be used. The mask 124 protects the gate material 122 in the first region 104 of the workpiece 102 from being implanted with the material 130. Preferably, the implantation process is well controlled so that the material 130 is not implanted into the high k gate dielectric material 120, for example.

Figure 3:
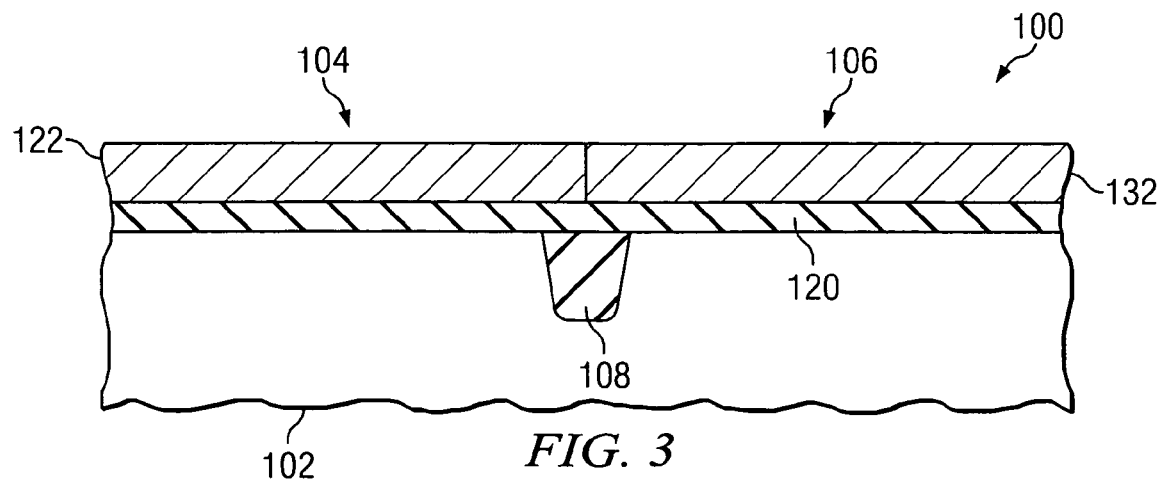

The mask 124 is then removed, as shown in FIG. 3. After the implantation step, the semiconductor device 100 comprises a first gate material 122 in the first region 104 of the workpiece 102 and a second gate material 132 in the second region 106 of the workpiece 102, as shown. The second gate material 132 comprises the material of the originally deposited gate material 122 and the material 130 implanted into the gate material 122 in the second region 106, for example. The second gate material 132 comprises a second metal, in one embodiment, wherein the second metal is different than the first metal and the first material. The second metal may comprise the first metal and the first material, for example. The second metal preferably comprises a metal alloy, a metal nitride, a metal silicon nitride, or a metal silicide, as examples.

The workpiece 102 may be annealed to cause the formation of an alloy in the gate material 132 in the second region 106, in one embodiment. For example, the workpiece 102 may be heated to a temperature of about 700 to 1000 degrees C. for about 30 to 60 seconds, although alternatively, the anneal process may comprise other temperatures and time periods. Alternatively, a later anneal step, e.g., to drive in dopants in the source and drain regions (see 136 in FIG. 5) may cause the formation of an alloy in the gate material 132 comprising the gate material 122 and the implanted material 130 in the second region 106. In another embodiment, the implanted material 130 remains as an implanted material in the second gate material 132, and may have a graded profile, e.g., having a greater concentration at the top surface of the second gate material 132 than at the bottom of the second gate material 132 proximate the gate dielectric material 120 in the second region 106.

Figure 4:
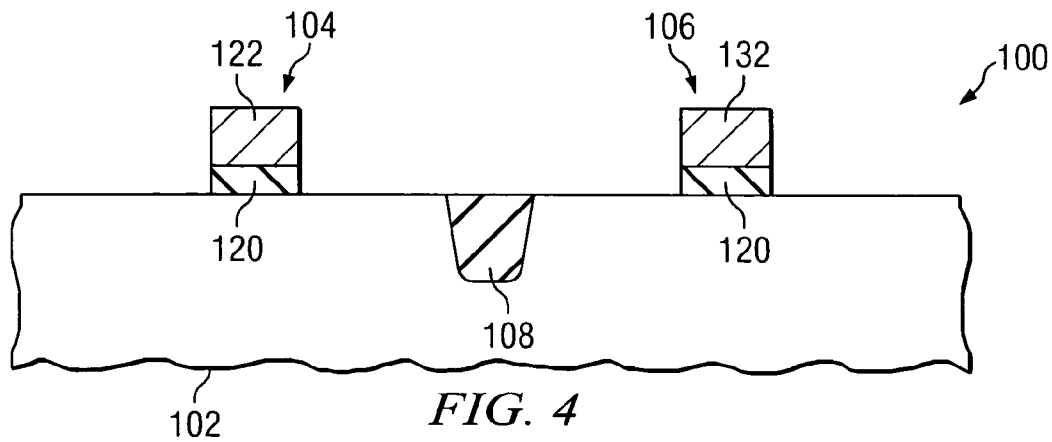
Figure 5:
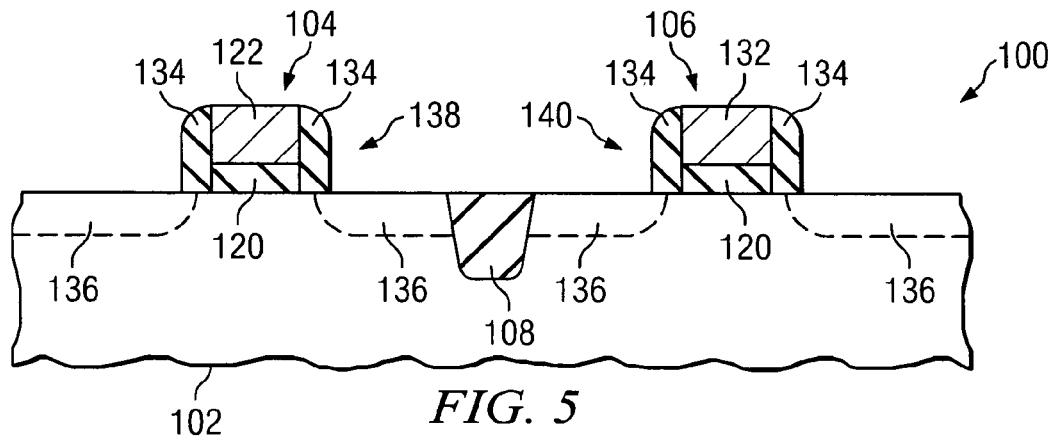

The gate materials 122 and 132 and the gate dielectric material 120 are then patterned and etched, as shown in FIG. 4, to form the gate and gate dielectric of a PMOS and NMOS transistor, for example. The exposed portions of the workpiece 102 may be lightly doped, e.g., with P or N type dopants, not shown. A spacer material 134 comprising an insulator such as an oxide or nitride material may be formed over the sidewalls of the gate and gate dielectric materials, as shown in FIG. 5. The exposed portion of the workpiece 102 may be implanted with P and N type dopants to form source and drain regions 136 in the workpiece 102, as shown.

The resulting semiconductor device 100 includes a CMOS device having a first transistor 138 formed in the first region 104 and a second transistor 140 formed in the second region 106, in one embodiment. Advantageously, the gate 122 of the first transistor 138 comprises a first metal, and the gate 132 of the second transistor 140 comprises a second metal, wherein the first metal and the second metal comprise different materials. The second metal of the second transistor gate 132 comprises the first metal of the first transistor gate 122 and the implanted material 130 that may comprise a first material, shown in FIG. 2. The first metal and the second metal of the transistor gates 122 and 132, respectively, are preferably selected to tune the work function of the CMOS device, e.g., the V$_{tp}$ and V$_{tn}$ may be tuned to be symmetric by the choice of the gate 122 and 132 materials.

In one embodiment, the first transistor 138 comprises a PMOS transistor and the second transistor 140 comprises an NMOS transistor. Alternatively, the embodiment shown in FIGS. 1 through 5 may comprise forming a second transistor 140 comprising a PMOS transistor in the second region 106 of the workpiece 102 and a first transistor 138 comprising an NMOS transistor in the first region 104 of the workpiece 102. In this embodiment, preferably the NMOS transistor region is masked using the mask 124 while the gate material comprising a first metal of the PMOS transistor is implanted with a first material to form a gate 132 comprising a second metal, for example.

In one embodiment, preferably the gate material 122 or 132 of the PMOS device (e.g., either the first transistor 138 or the second transistor 140) comprises Hf, and the gate material 122 or 132 of the NMOS device (e.g., either the first transistor 138 or the second transistor 140) comprises Hf—Ru, for example. The Hf gate material sets the work function of the PMOS device, and the Hf—Ru sets the work function of the NMOS device, in this embodiment.

Figure 6:
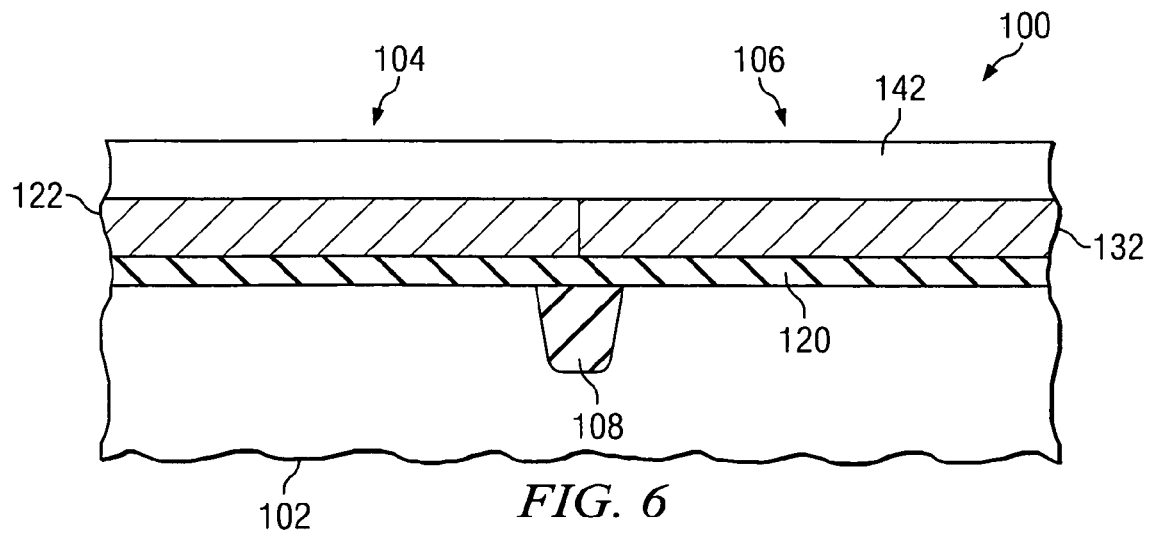
FIGS. 6 and 7 show an embodiment of the present invention, wherein a layer of semiconductive material is formed over the first transistor gate material and the second transistor gate material, before patterning the first and second transistor gates.
Figure 7:
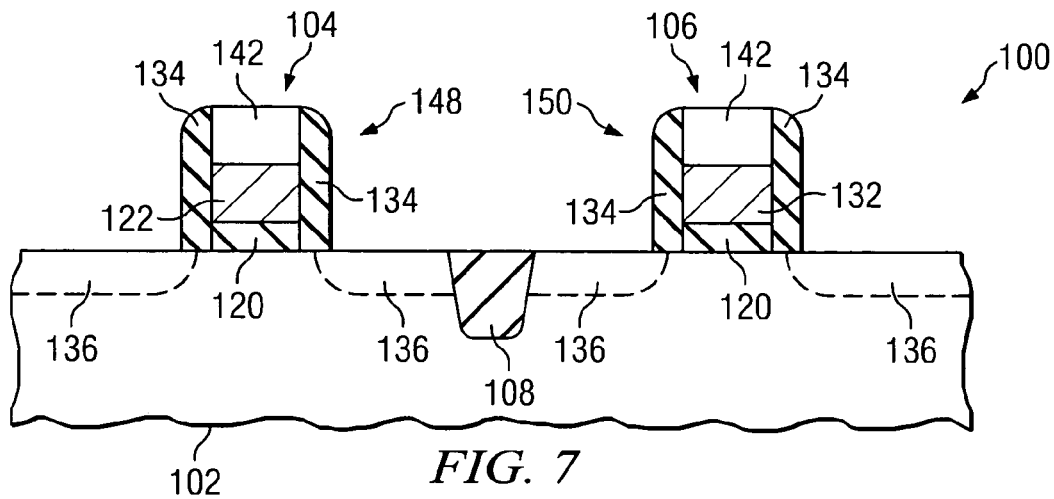

FIGS. 6 and 7 show an embodiment of the present invention wherein, after the manufacturing step shown in FIG. 3, a layer of semiconductive material 142 is formed over the first gate material 122 and the second gate material 132, before patterning the first and second transistor gates, as shown in FIG. 6. The semiconductive material 142 may comprise polysilicon or amorphous polysilicon, as examples, although alternatively, the semiconductive material 142 may comprise other materials. The semiconductive material 142 may comprise a thickness of about 2500 Å or less, and may comprise a thickness of about 1000 to 1500 Å, in one embodiment.

The semiconductive material 142, first gate material 122, second gate material 132, and gate dielectric material 120 are patterned and etched, and spacers 134 are formed on the side walls thereof, as shown in FIG. 7, forming a first transistor 148 and a second transistor 150. The semiconductive material 142 may be doped with a P or N type dopant in the first region 104 or second region 106, either before or after the patterning step of the gate and gate dielectric materials. For example, the semiconductive material 142 may be N doped by doping the semiconductive material 142 with phosphorus or arsenic (As). Alternatively, in another embodiment, the semiconductive material 142 may be P doped by doping the semiconductive material 142 with boron (B).

For example, if the first transistor 148 comprises a PMOS transistor, the semiconductive material 142 in the first region 104 may be doped with a P type dopant, and if the second transistor 150 comprises an NMOS transistor, the semiconductive material 142 in the second region 106 may be doped with an N type dopant, to form source and drain regions 136, as examples. In this embodiment, one side (e.g., either first region 104 or second region 106) is masked while the other is implanted with dopants, using a photoresist or other masking material, not shown.

Figure 8:
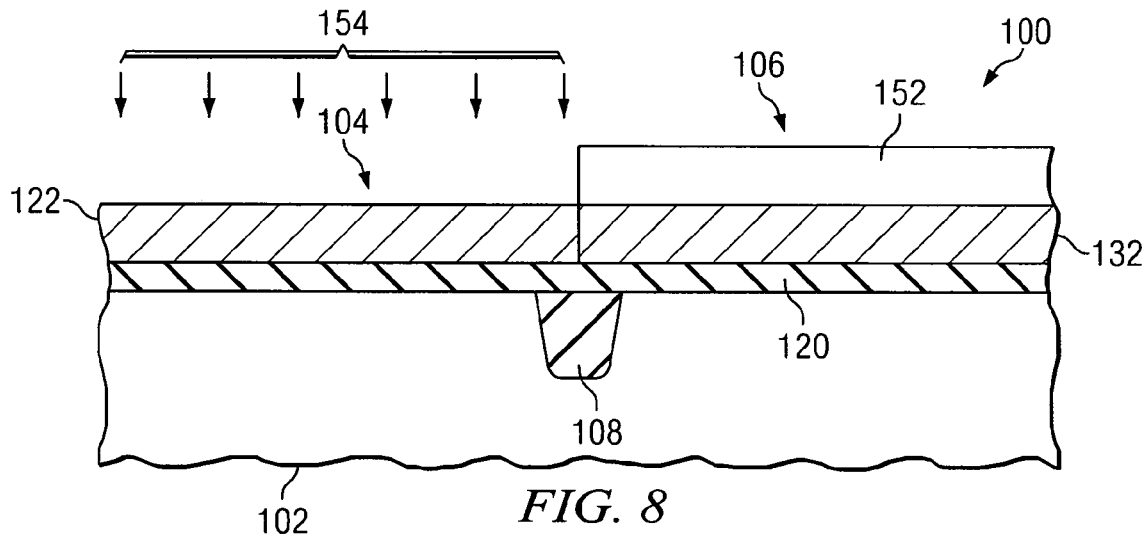
FIGS. 8 through 10 show cross-sectional views of another method of forming a CMOS device in accordance with an embodiment of the present invention at various stages of manufacturing, wherein the first metal in the region of the first transistor is implanted with a second material to form a third metal.
Figure 9:
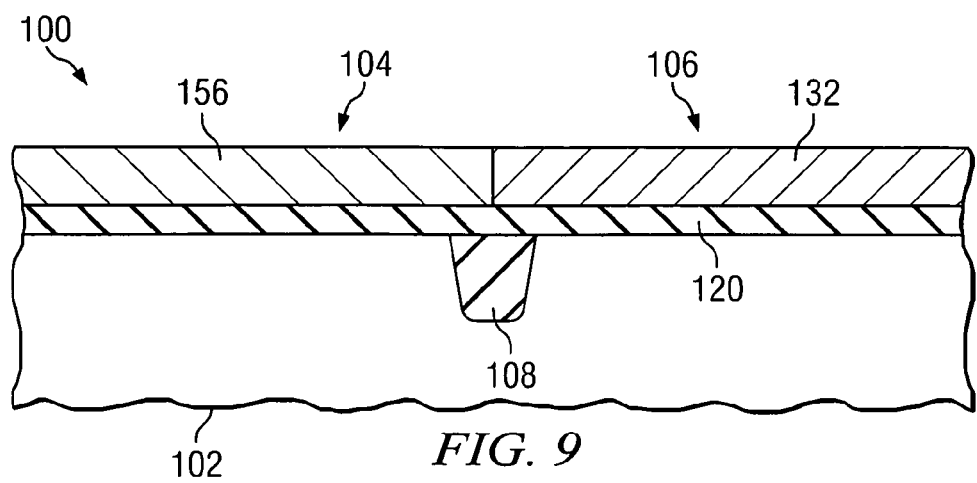
Figure 10:
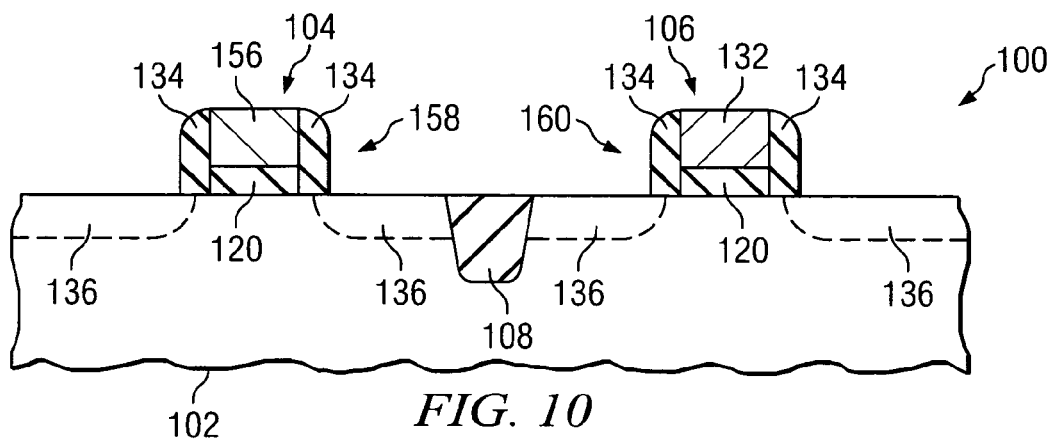

FIGS. 8 through 10 show cross-sectional views of another method of forming a CMOS device in accordance with an embodiment of the present invention at various stages of manufacturing. In this embodiment, the first gate material 122 comprising a first metal is implanted with a material 154 preferably comprising a second material to form an altered or implanted first gate material 156 comprising a third metal.

After the manufacturing step shown in FIG. 3, a mask 152, shown in FIG. 8, comprising a photoresist or hard mask is deposited over the first gate material 122 and the second gate material 132, and the mask 152 is removed from over the first region 104 of the workpiece 102, as shown. The exposed first gate material 122 in the first region 104 is implanted with a material 154. The material 154 preferably comprises a second material in one embodiment. For example, in one embodiment, the second material 154 preferably comprises Hf or Ta, although the implanted material 154 may alternatively comprise other materials. The second material 154 may comprise Hf, Ta, Ru, Mo, Re, Pt, Si, or N, as examples, although other materials may also be used. Preferably, the implantation process is well controlled so that the material 154 is not implanted into the high k gate dielectric material 120, for example. The material preferably comprises a different material than the first gate material 122 and the first material 130 (see FIG. 2).

Thus, after the implantation of the material 154, the gate material in the first region 104 comprises a first gate material 156, as shown in FIG. 9, wherein the first gate material 156 comprises a third metal, the third metal preferably being different than the second metal of the second gate material 132, and also preferably being different from the unimplanted first gate material 122 comprising the first metal, for example. The first gate material 156 in this embodiment preferably comprises a third metal comprising the first metal and the second material, for example.

The first gate material 156 and the second gate material 132 are patterned and etched, and the manufacturing process is continued to form a first transistor 158 in the first region and a second transistor 160 in the second region of the workpiece 102, as shown in FIG. 10, and as previously described with reference to FIGS. 5 and 7.

Figure 11:
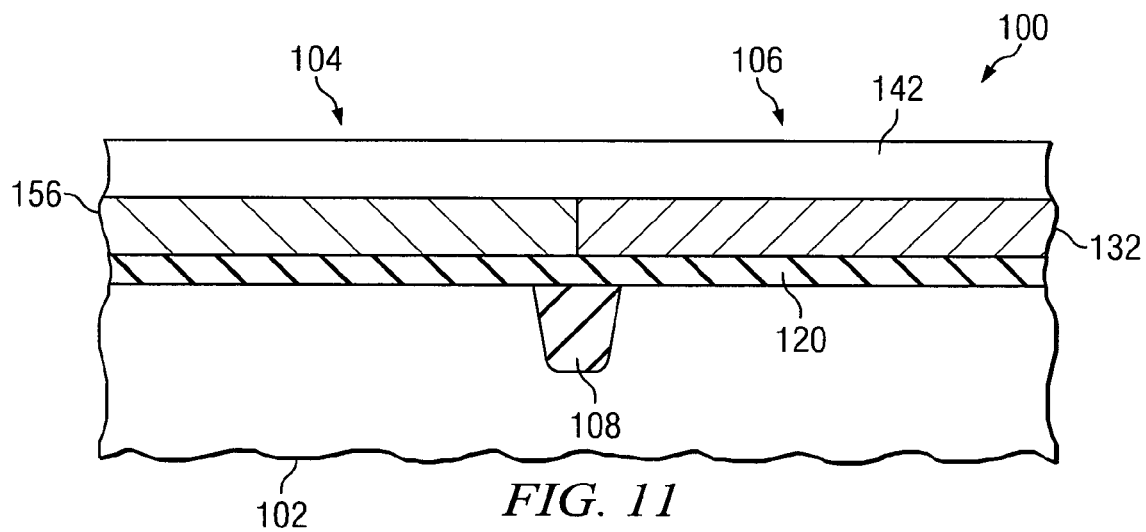
FIGS. 11 through 12 show yet another embodiment of the present invention, wherein the CMOS device shown in FIGS. 8 through 10 includes a semiconductive material formed over the first transistor gate material and the second transistor gate material.
Figure 12:
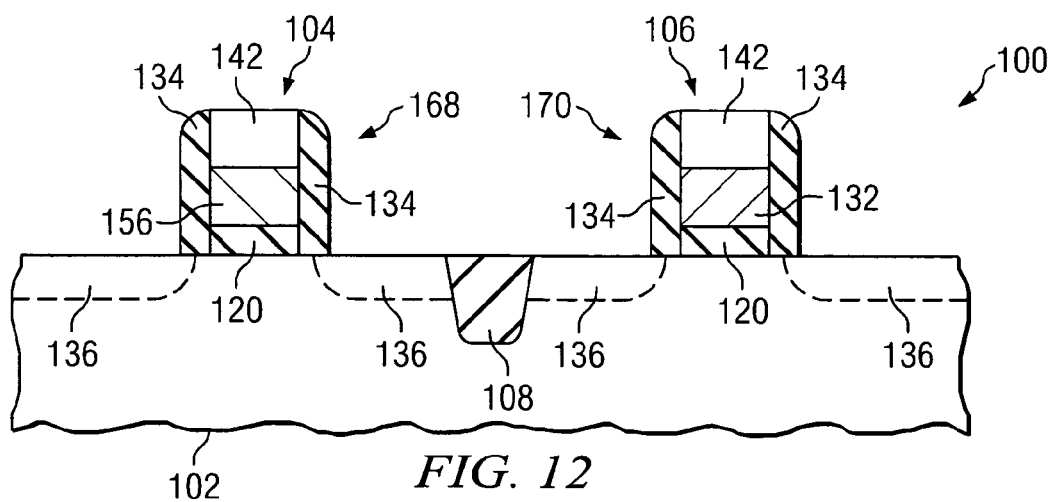

FIGS. 11 through 12 show yet another embodiment of the present invention, wherein the embodiment shown and described with reference to FIGS. 8 through 10 includes a semiconductive material 142 formed over the first transistor gate material 156 and the second transistor gate material 132. In this embodiment, after the manufacturing step shown in FIG. 9, a semiconductive material 142 is formed over the first gate material 156 and the second gate material 132, before patterning the first and second transistor gates, as shown in FIG. 11. The semiconductive material 142 may comprise polysilicon or amorphous polysilicon, as examples, although alternatively, the semiconductive material 142 may comprise other materials. The semiconductive material 142 may comprise a thickness of about 2500 Å or less, and may comprise a thickness of about 1000 to 1500 Å, in one embodiment.

The semiconductive material 142, first gate material 156, second gate material 132, and gate dielectric material 120 are patterned and etched, and spacers 134 are formed on the sidewalls thereof, as shown in FIG. 12, forming a first transistor 168 and a second transistor 170. The semiconductive material 142 may be doped with a P or N type dopant in the first region 104 or second region 106. For example, if the first transistor 148 comprises an NMOS transistor, the semiconductive material 142 in the first region 104 may be doped with an N type dopant, and if the second transistor 150 comprises a PMOS transistor, the semiconductive material 142 in the second region 106 may be doped with a P type dopant, as examples. In this embodiment, one side is masked while the other is doped, using a photoresist or other masking material, not shown.

FIGS. 13 through 16 illustrate another embodiment of the present invention, wherein a first gate metal 272 and a second gate metal 274 are disposed over a gate dielectric material 220, and one transistor region, e.g., such as second region 206, is implanted to alter at least the second gate metal 274, followed by an anneal process to form a first alloy 282 in the first region 204 and second alloy 284 in the second region 206 of the workpiece.

In FIGS. 13 through 18, like numerals are used for the various elements that were described in FIGS. 1 through 12. To avoid repetition, each reference number shown in FIGS. 13 through 18 are not described again in detail herein.

Rather, similar materials x02, x20, x22, etc . . . are preferably used for the various material layers shown as were described for FIGS. 1 through 12, where x=1 in FIGS. 1 through 12 and x=2 in FIGS. 13 through 18. As an example, the preferred and alternative materials and dimensions described for the gate dielectric material 120 in the description for FIGS. 1 through 12 are preferably also used for the gate dielectric material 220 shown in FIGS. 13 through 18.

In the embodiment shown in FIGS. 13 through 16, after a gate dielectric material 220 preferably comprising a high k dielectric material is formed over the workpiece 202, a first gate metal 272 is formed over the gate dielectric material 220, and a second gate metal 274 is formed over the first gate metal 272. The first gate metal 272 preferably comprises a thickness of about 150 Å or less, and more preferably comprises a thickness of about 50 to 100 Å, although alternatively, the first gate metal 272 may comprise other dimensions. The first gate metal 272 preferably comprises Ta, and also may comprise Ru or Mo, as examples, although alternatively, the first gate metal 272 may comprise other materials. The second gate metal 274 preferably comprises a thickness of about 300 Å or less, and more preferably comprises a thickness of about 150 to 250 Å, although alternatively, the second gate metal 274 may comprise other dimensions. The second gate metal 274 preferably comprises a different material than the first gate metal 272. For example, the second gate metal 274 preferably comprises Mo, and also may comprise Ru, Re, Pt, Co, Ta, or Rh, as examples, although alternatively, the second gate metal 274 may comprise other materials.

Figure 13:
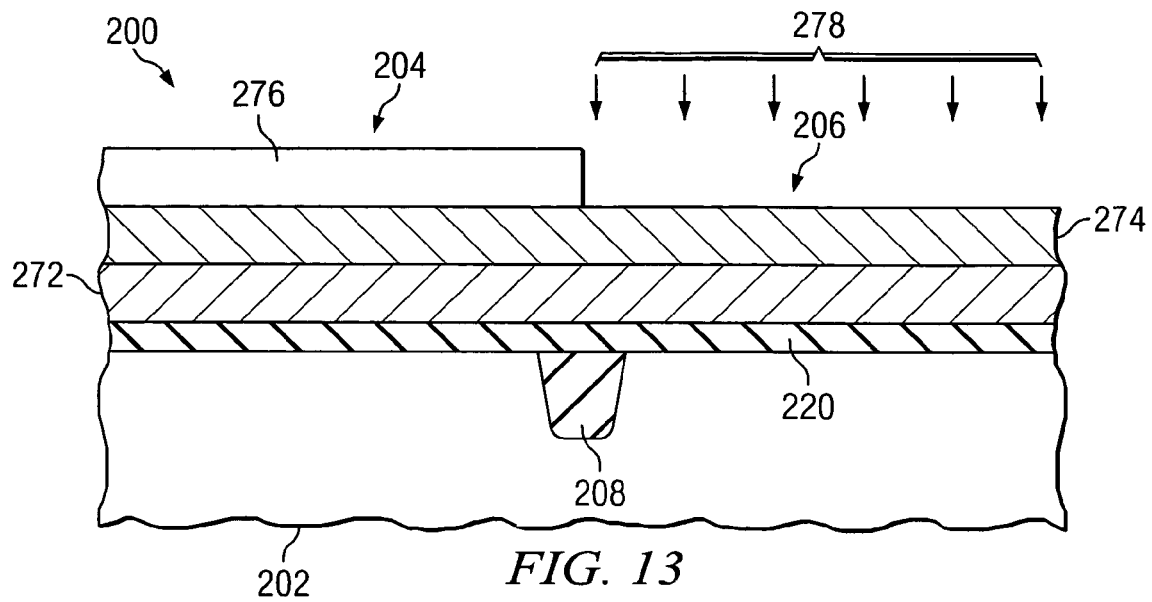
FIGS. 13 through 16 illustrate another embodiment of the present invention, wherein a first gate metal and a second gate metal are disposed over a gate dielectric material, and one transistor region is implanted to alter at least the second gate metal, followed by an anneal process to form a first alloy in one region and second alloy in another region of the workpiece.

A mask 276 comprising a photoresist or other masking material is formed over the first region 204 of the workpiece 202, and a material 278 is implanted into at least the second gate metal 274, as shown in FIG. 13. In one embodiment, the material 278 preferably comprises a semiconductive material or a nitride, and alternatively may comprise a metal such as Ru, Mo, Pt, Re, Co, or Rh, as examples, although the material 278 may also comprise other materials. For example, the implanted material 278 may comprise a semiconductive material such as Si+, or a nitride, such as N+, as examples, although alternatively, the material 278 may comprise other materials.

Preferably, in one embodiment, the implanted material 278 comprises Si or N. In this embodiment, because the implanted material 278 is not a metal, implementing the material 278 implantation into existing manufacturing process flows is made easier, for example. However, the implanted material 278 may also comprise a metal, in other embodiments.

Figure 14:
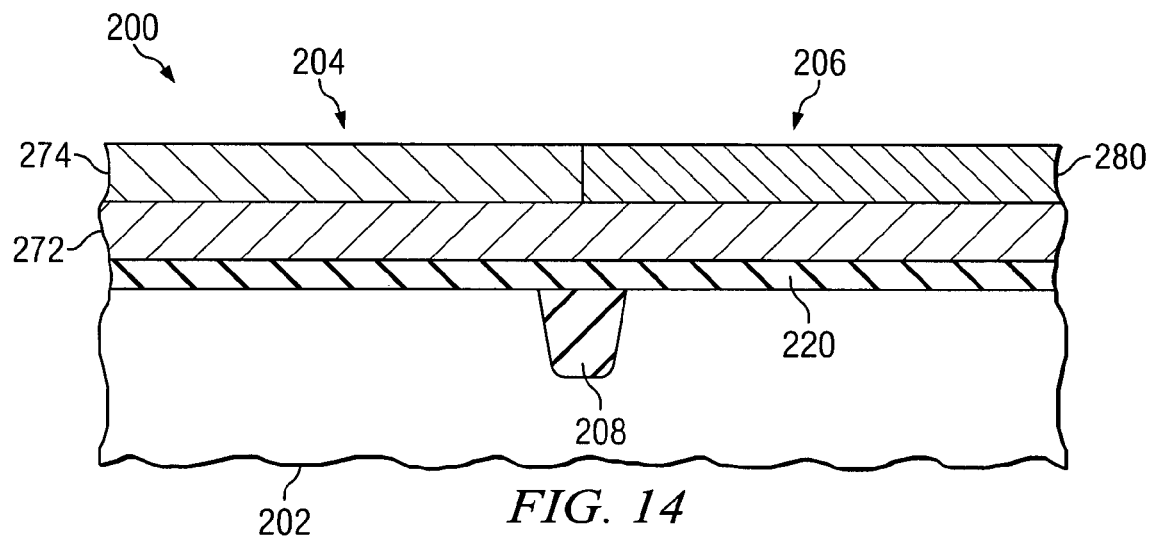

The implantation process may be achieved at room temperature, although alternatively, other temperatures may be used. Preferably, the implantation process is well controlled so that the material 278 is not implanted into the high k gate dielectric material 220, for example. The implanted material 278 alters the second gate metal 274 in the second region 206, to form an altered second gate metal 280, as shown in FIG. 14. The mask 276 is then removed.

Figure 15:
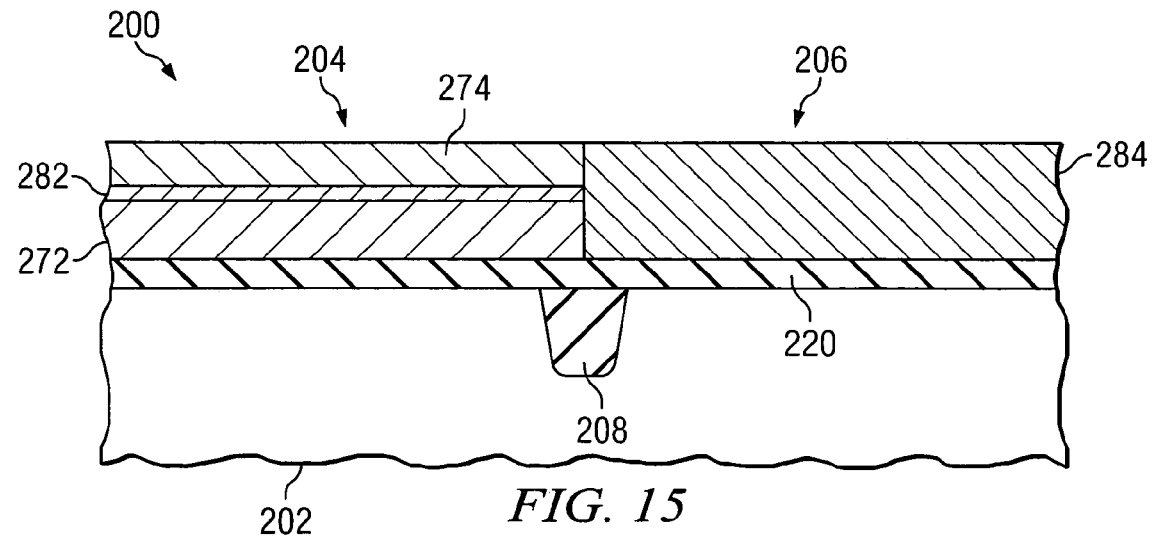
Figure 16:
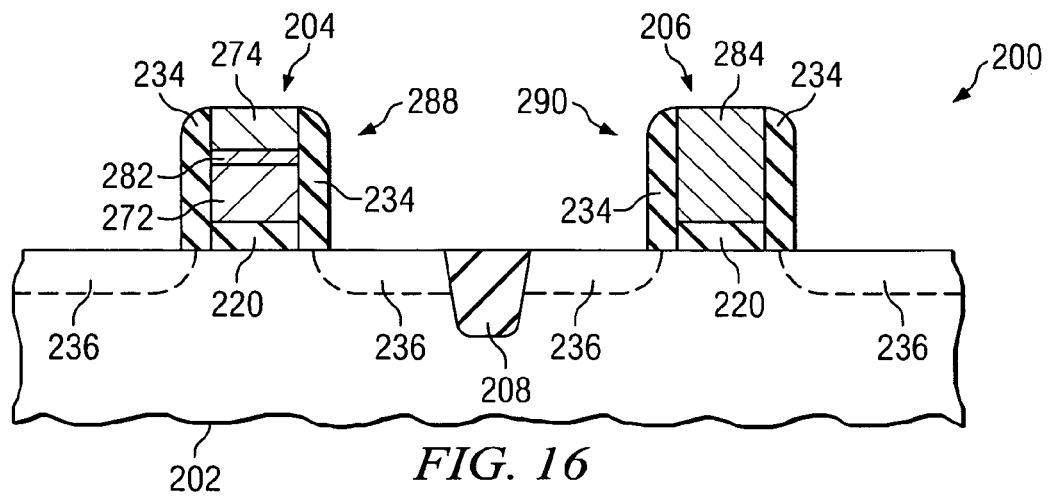

The workpiece 202 is annealed or heated to form a first alloy 282 between the first gate metal 272 and the second gate metal 274 in the first region 204, and a second alloy 284 in the second region 206, as shown in FIG. 15. For example, the workpiece 202 may be heated to a temperature of about 700 to 1000 degrees C. for about 30 to 60 seconds, although alternatively, the workpiece 202 may be heated to other temperatures for other lengths of time. Advantageously, because the implanted material 278 was implanted in the second region 206 and not in the first region 204 of the workpiece, the gate material in the first region 204 and the gate material in the second region 206 are different, and thus a different work function is set for the transistors to be formed in the first region 204 and the second region 206. The gate materials 274, 282, 272, and 284, and the gate dielectric material 220 are patterned and etched, and the manufacturing process is continued, to form a first transistor 288 in the first region 204 and a second transistor 290 in the second region 206, as shown in FIG. 16.

Figure 17:
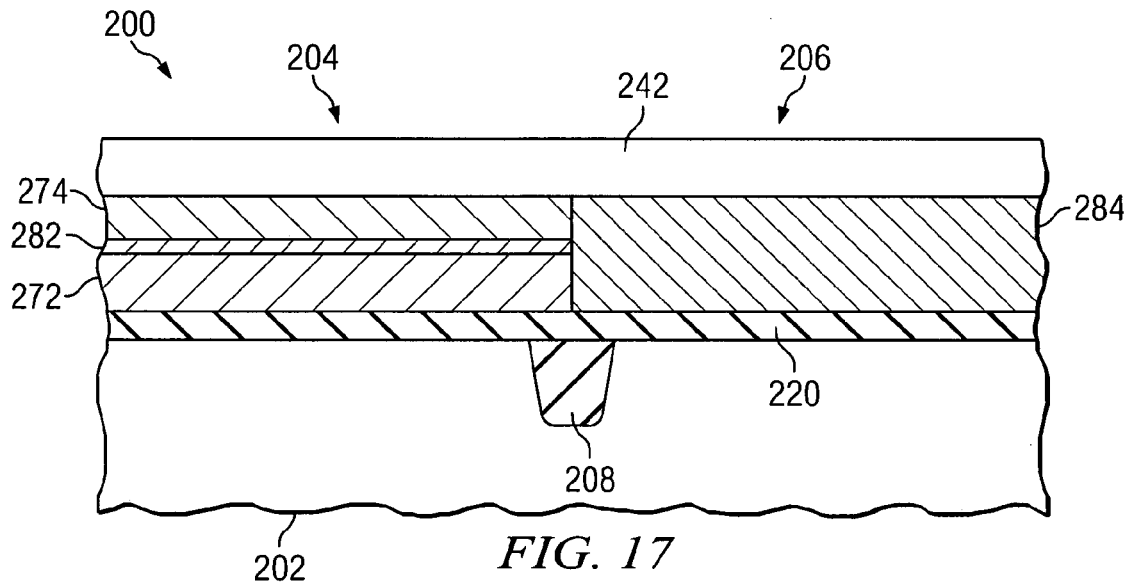
FIGS. 17 and 18 show cross-sectional views of the embodiment of FIGS. 13 through 16, wherein the transistor gates include a semiconductive material formed over the gate metals.
Figure 18:
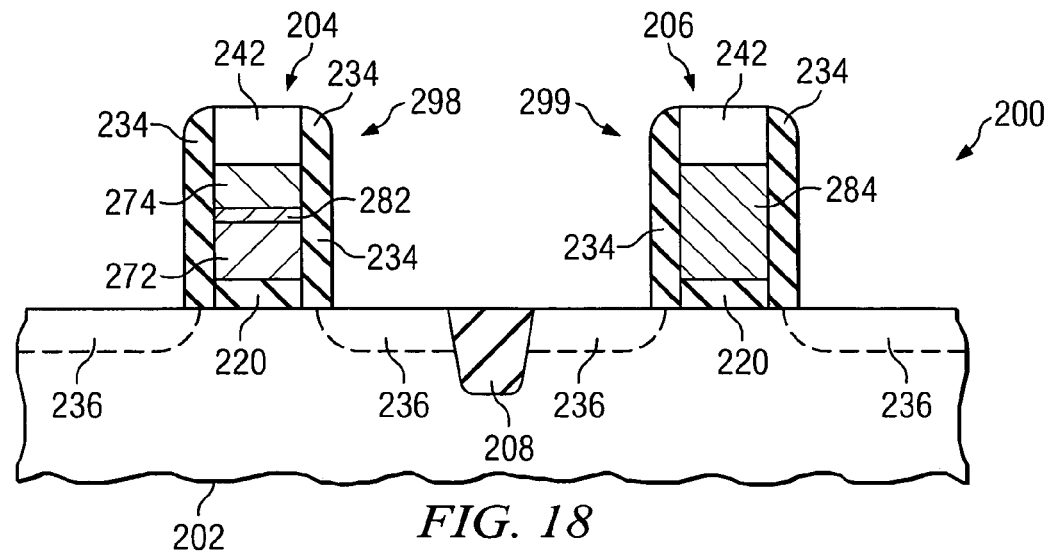

FIGS. 17 and 18 illustrate an embodiment of the invention, wherein the embodiment shown in FIGS. 13 through 16 further comprises a semiconductive material 242 formed over the transistor gate materials 274 and 284 after the anneal step shown in FIG. 15. The semiconductive material 242, gate material 274, 282, 272, and 284, and gate dielectric material 220 are patterned and etched, and spacers 234 are formed on the sidewalls thereof, as shown in FIG. 18, forming a first transistor 298 and a second transistor 299. The semiconductor material 242 may be implanted with a dopant, as described with reference to the embodiments shown in FIGS. 6, 7, 11, and 12.

After the manufacturing steps shown in FIGS. 5, 7, 10, 12, 16 and 18, the manufacturing process for the semiconductor devices 100 and 200 is then continued. For example, one or more insulating materials (not shown) may be deposited over the first transistors 138, 148, 158, 168, 288, 298 and second transistors 140, 150, 160, 170, 290, 299, and contacts may be formed in the insulating materials in order to make electrical contact with the gates, sources and/or drains. Additional metallization and insulating layers may be formed and patterned over the top surface of the insulating material and contacts. A passivation layer (not shown) may be deposited over the insulating layers or the first transistors 138, 148, 158, 168, 288, 298 and second transistors 140, 150, 160, 170, 290, 299. Bond pads (also not shown) may be formed over contacts, and the semiconductor devices 100 and 200 may then be singulated or separated into individual die. The bond pads may be connected to leads of an integrated circuit package (not shown) or other die, for example, in order to provide electrical contact to the first transistors 138, 148, 158, 168, 288, 298 and second transistors 140, 150, 160, 170, 290, 299 136 and 138 of the semiconductor devices 100 and 200.

Thus, novel semiconductor CMOS devices 100 and 200 comprising first transistors 138, 148, 158, 168, 288, 298 and second transistors 140, 150, 160, 170, 290, 299 are formed in accordance with embodiments of the present invention, wherein the gate material of the first transistors 138, 148, 158, 168, 288, 298 is different from the gate material of the second transistors 140, 150, 160, 170, 290, 299. Advantages of preferred embodiments of the present invention include providing methods of fabricating CMOS devices 100 and 200 and structures thereof, wherein the PMOS transistor and NMOS transistor, e.g., first transistors 138, 148, 158, 168, 288, 298 and second transistors 140, 150, 160, 170, 290, 299, have a substantially symmetric $V_t$. For example, $V_{tn}$ may be about +0.2 to +5 V, and $V_{tp}$ may be the substantially the same negative value, e.g., about −0.2 to −5 V. The threshold voltages $V_t$ may alternatively comprise other voltage levels, for example. Implantation is used to alter the metal of the gate of the PMOS transistor, the gate of the NMOS transistor, or both. The material selection of the metal gates sets the work function of the CMOS devices 100 and 200. Because an additional etch process is not used to remove one of the metal gate materials from over the high k dielectric gate material 120 and 220, (e.g., in addition to the etch process used to pattern the gate materials), damage to and charging of the high k dielectric material 120 and 220 is reduced or avoided.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    providing a workpiece, the workpiece comprising a first region and a second region;
    forming a gate dielectric material over the workpiece;
    forming a first gate material over the gate dielectric material, the first gate material comprising a first metal;
    implanting a first material that is different from said first metal into the first gate material over the second region of the workpiece to form a second gate metal in the second region of the workpiece;
    implanting a second material, that is different than said implanted first material, into the first gate material over the first region of the workpiece, forming a third metal; and
    patterning the first gate material, the second gate metal, and the gate dielectric material to form a first transistor in the first region of the workpiece and a second transistor in the second region of the workpiece, the first transistor including a first gate comprised of the first gate material, and the second transistor including a second gate comprised of the second gate metal.

2. The method according to claim 1, wherein implanting the first material comprises implanting Ta, Hf, Ru, Mo, Re, Pt, Si, or N.

3. The method according to claim 1, wherein implanting the second material comprises implanting one of Hf, Ta, Ru, Mo, Re, Pt, Si, or N that is different from said implanted first material.

4. The method according to claim 1, wherein forming the first gate material comprises fanning about 1000 Å or less of Ti, Hf, Ta, W, Al, Ru, Co, Ir, Y, Pt, Pd, Re, Rh, Zr, Mo, Pr, V, or combinations thereof.

5. The method according to claim 1, further comprising depositing a semiconductor material over the first gate material and the second gate material, before patterning the first gate material, the second gate material, and the gate dielectric, and further comprising patterning the semiconductor material, wherein the first gate and the second gate comprise the semiconductor material.

6. The method according to claim 5, further comprising implanting the semiconductor material of the first gate with a P type dopant, and implanting the semiconductor material of the second gate with an N type dopant.

7. The method according to claim 1, wherein forming the gate dielectric material comprises forming a material having a dielectric constant of about 4.0 or greater.

8. The method according to claim 7, wherein forming the gate dielectric material comprises forming $HFO_2$, $HfSiOX$, $Al_2O_3$, $ZrO_2$, $ZrSiOX$, $Ta_2O_5$, $La_2O_3$, nitrides thereof, $Si_xN_y$, $SiON$, $HfAlOx$, $HfAlOxN1-x-y$, $ZrAlOx$, $ZrAlOxNy$, $SiAlOx$, $SiAlOxN1-x-y$, $HfSiAlOx$, $HfSiAlOxNy$, $ZrSiAlOx$, $ZrSiAlOxNy$, combinations thereof, or combinations thereof with $SiO_2$.

9. The method according to claim 1, wherein forming the first transistor comprises forming a positive channel metal oxide semiconductor (PMOS) device or a negative channel metal oxide semiconductor (NMOS) device, and wherein forming the second transistor comprises forming an NMOS device or a PMOS device, respectively.

10. A method of manufacturing a complimentary metal oxide semiconductor (CMOS) device, the method comprising:
    providing a workpiece, the workpiece comprising a first region and a second region;
    forming a gate dielectric material over the workpiece, the gate dielectric material comprising a dielectric constant of about 4.0 or greater;
    forming a first gate material over the gate dielectric material, the first gate material comprising a first metal;
    forming a second gate material over the first gate material;
    implanting a first material into said second gate material over the second region of the workpiece to form a third material in the second region of the workpiece, the third gate material comprising a second metal, the second metal comprising the first metal and the first material; and
    patterning the first gate material, the second gate material, and the gate dielectric material to form a first transistor in the first region of the workpiece and a second transistor in the second region of the workpiece, the first transistor including a first gate comprised of the first gate material, and the second transistor including a second gate comprised of the second gate material, wherein forming either the first transistor or the second transistor comprises forming a positive channel metal oxide semiconductor (PMOS) device or a negative channel metal oxide semiconductor (NMOS) device.

11. A method of manufacturing a semiconductor device, the method comprising:
    providing a workpiece, the workpiece comprising a first region and a second region;
    forming a gate dielectric material over the workpiece;
    forming a first gate metal over the gate dielectric material;
    forming a second gate metal over the first gate metal;
    implanting a material into at least the second gate metal over the second region of the workpiece; and
    patterning the first gate metal, the second gate metal, and the gate dielectric material to form a first transistor in the first region of the workpiece and a second transistor in the second region of the workpiece, the first transistor including a first gate comprised of the first gate metal, and the second transistor including a second gate comprised of the second gate metal.

12. The method according to claim 11, wherein implanting the material comprises implanting Ta, Hf, Ru, Mo, Re, Pt, Si, or N.

13. The method according to claim 11, further comprising implanting a second material into the first gate metal over the first region of the workpiece, forming a third metal.

14. The method according to claim 13, wherein implanting the second material comprises implanting Hf, Ta, Ru, Mo, Re, Pt, Si, or N.

15. The method according to claim 11, wherein forming the first gate metal comprises forming about 1000 Å or less of Ti, Hf, Ta, W, Al, Ru, Co, Ir, Y, Pt, Pd, Re, Rh, Zr, Mo, Pr, V, or combinations thereof.

16. The method according to claim 11, wherein forming the first transistor comprises forming a positive channel metal oxide semiconductor (PMOS) device or a negative channel metal oxide semiconductor (NMOS) device, and wherein forming the second transistor comprises forming an NMOS device or a PMOS device, respectively.

17. The method according to claim 11, wherein implanting the material comprises implanting a first material, the first material being different from the first metal.

18. The method according to claim 11, further comprising annealing the workpiece to form a first alloy in the first region of the workpiece and a second alloy in the second region of the workpiece, the second alloy being different than the first alloy.

19. The method according to claim 18, wherein forming the first alloy comprises forming the first alloy at an interface between the first gate metal and the second gate metal.

20. The method according to claim 18, wherein forming the second alloy comprising forming the second alloy comprised of the first gate metal, the second gate metal, and the implanted material.

21. The method according to claim 11, wherein implanting the material comprises implanting a semiconductor material, a nitride, or a metal.

22. The method according to claim 21, wherein implanting the material comprises implanting Si+, N+, Ru, Mo, Pt, Re, Co, or Rh.

23. The method according to claim 11, wherein forming the first gate metal comprises forming about 150 Å or less of Ta, Ru, or Mo, and wherein forming the second gate metal comprises forming about 300 Å or less of Mo, Ru, Re, Pt, Co, Ta, or Rh.

* * * * *

UNITED STATES PATENT AND TRADEMARK OFFICE
CERTIFICATE OF CORRECTION

PATENT NO. : 7,253,050 B2  Page 1 of 1
APPLICATION NO. : 11/017129
DATED : August 7, 2007
INVENTOR(S) : Luan et al.

It is certified that error appears in the above-identified patent and that said Letters Patent is hereby corrected as shown below:

Title Page:
On the cover page, Sect. (56) References Cited, OTHER PUBLICATIONS, Page 2, third entry, delete "(s 800° C)" and insert --(≤800° C)--.
On the cover page, Sect. (56) References Cited, OTHER PUBLICATIONS, Page 2, third entry, delete "Lost" and insert --Los--.
In Col. 9, line 28, delete "side walls" and insert --sidewalls--.
In Col. 13, line 58, delete "fanning" and insert --forming--.
In Col. 14, lines 8-14, delete "8. The method according to claim 7, wherein forming the gate dielectric material comprises forming HFO2, HfSiOX, Al2O3, ZrO2, ZrSiOX, Ta2O5, La2O3, nitrides thereof, SixNy, SiON, HfAlOx, HfAlOxN1-x-y, ZrAlOx, ZrAlOxNy, SiAlOx, SiAlOxN1-x-y, HfSiAlOx, HfSiAlOxNy, ZrSiAlOx, ZrSiAlOxNy, combinations thereof, or combinations thereof with SiO2." and insert --8. The method according to claim 7, wherein forming the gate dielectric material comprises forming $HfO_2$, $HfSiO_x$, $Al_2O_3$, $ZrO_2$, $ZrSiO_x$, $Ta_2O_5$, $La_2O_3$, nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$.--

Signed and Sealed this

Eleventh Day of December, 2007

JON W. DUDAS
*Director of the United States Patent and Trademark Office*